(12) United States Patent
Hosokawa et al.

(10) Patent No.: US 12,027,531 B2
(45) Date of Patent: *Jul. 2, 2024

(54) DISPLAY DEVICE

(71) Applicant: Japan Display Inc., Minato-ku (JP)

(72) Inventors: Daichi Hosokawa, Minato-ku (JP); Naoki Miyanaga, Minato-ku (JP); Masakatsu Kitani, Minato-ku (JP)

(73) Assignee: Japan Display Inc., Tokyo (JP)

( * ) Notice: Subject to any disclaimer, the term of this patent is extended or adjusted under 35 U.S.C. 154(b) by 134 days.

This patent is subject to a terminal disclaimer.

(21) Appl. No.: 17/501,014

(22) Filed: Oct. 14, 2021

(65) Prior Publication Data

US 2022/0037367 A1 Feb. 3, 2022

Related U.S. Application Data

(63) Continuation of application No. 16/839,121, filed on Apr. 3, 2020, now Pat. No. 11,171,162, which is a (Continued)

(30) Foreign Application Priority Data

Sep. 28, 2017 (JP) .................................. 2017-187686

(51) Int. Cl.
*H01L 27/12* (2006.01)
*G02F 1/1362* (2006.01)
(Continued)

(52) U.S. Cl.
CPC ...... *H01L 27/124* (2013.01); *G02F 1/136286* (2013.01); *G09G 3/3674* (2013.01);
(Continued)

(58) Field of Classification Search
CPC ... H01L 27/124–1244; G02F 1/136286; G02F 1/1345–13458;
(Continued)

(56) References Cited

U.S. PATENT DOCUMENTS 11,171,162 B2 * 11/2021 Hosokawa ........... G09G 3/3677
2008/0050851 A1 2/2008 Tanaka
(Continued)

FOREIGN PATENT DOCUMENTS

JP 2010-164765 A 7/2010
JP 2018-534613 A 11/2018
(Continued)

OTHER PUBLICATIONS

Office Action dated May 25, 2021 in corresponding Japanese Patent Application No. 2017-187686 (with English Translation), 13 pages.
(Continued)

*Primary Examiner* — Laura M Menz
*Assistant Examiner* — Candice Chan
(74) *Attorney, Agent, or Firm* — Maier & Maier, PLLC

(57) ABSTRACT

A display device may include a substrate; a plurality of signal lines on the substrate; a plurality of scan lines on the substrate, the scan lines crossing the signal lines; and a plurality of thin film transistors at crossing positions of the scan lines and the signal lines. The scan lines include some first scan lines and some second scan lines. Each of the second scan lines has an end connected to a load element.

4 Claims, 10 Drawing Sheets

Related U.S. Application Data continuation of application No. 16/132,908, filed on Sep. 17, 2018, now Pat. No. 10,651,207.

(51) Int. Cl.
*G09G 3/36* (2006.01)
*H10K 59/131* (2023.01)

(52) U.S. Cl.
CPC ....... *G09G 3/3677* (2013.01); *G02F 2201/56* (2013.01); *G09G 2300/0426* (2013.01); *G09G 2310/0232* (2013.01); *G09G 2320/0233* (2013.01); *H10K 59/131* (2023.02)

(58) Field of Classification Search
CPC .............................. H10K 59/131–1315; G09G 2300/0421–0434; H05B 33/26–28
See application file for complete search history.

(56) References Cited

U.S. PATENT DOCUMENTS

| | | | |
|---|---|---|---|
| 2009/0102824 A1 | 4/2009 | Tanaka et al. | |
| 2010/0156945 A1* | 6/2010 | Yoshida | G09G 3/3648 345/84 |
| 2010/0214195 A1 | 8/2010 | Ogasawara et al. | |
| 2016/0019856 A1 | 1/2016 | Tanaka et al. | |
| 2017/0288003 A1 | 10/2017 | Kim | |
| 2018/0204889 A1 | 7/2018 | Yu et al. | |
| 2019/0148465 A1 | 5/2019 | Yu et al. | |
| 2020/0219945 A1 | 7/2020 | Yu et al. | |

FOREIGN PATENT DOCUMENTS

| | | |
|---|---|---|
| WO | WO 2007/105700 A1 | 9/2007 |
| WO | WO 2009/057342 A1 | 5/2009 |
| WO | WO 2014/142183 A1 | 9/2014 |

OTHER PUBLICATIONS

Japanese Office Action dated May 31, 2022 in Japanese Patent Application No. 2021-140135 (with unedited computer-generated English translation), 7 pages.

\* cited by examiner

FIG.4
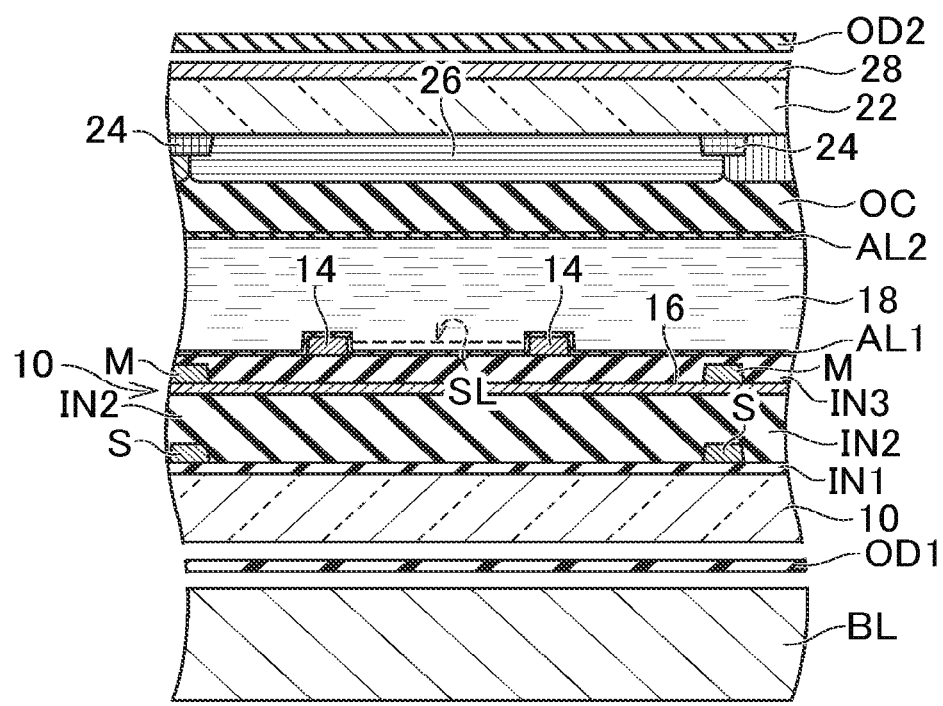
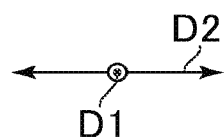

DISPLAY DEVICE

CROSS-REFERENCE TO RELATED APPLICATIONS

This application is continuation of and claims the benefit of priority under 35 U.S.C. § 120 from U.S. application Ser. No. 16/839,121 filed Apr. 3, 2020, which is a continuation of U.S. application Ser. No. 16/132,908 filed Sep. 17, 2018 (now U.S. Pat. No. 10,651,207 issued May 12, 2020), and claims the benefit of priority under 35 U.S.C. § 120 from Japanese Application No. 2017-187686 filed Sep. 28, 2017, the contents of each of which are incorporated herein by reference.

BACKGROUND OF THE INVENTION

1. Field of the Invention

This relates to display devices.

2. Description of the Related Art

Display devices are designed to input image signals to pixel electrodes corresponding to a selected scan line. The scan line has a gate electrode, at a position overlapping with a semiconductor layer of a thin film transistor, for controlling input of each image signal to each pixel electrode. In a display area of a non-rectangular shape, the scan lines have different lengths whereby each of them is connected to a different number of thin film transistors and gate electrodes (WO2007/105700).

The scan lines of different lengths have different loads whereby pulse signals input in the scan lines differently fall. A short scan line with fewer gate electrodes has low capacitive reactance and a light load, whereby a pulse of a gate signal sharply falls. Consequently, different voltages are applied to the pixel electrodes, differentiating brightness for scan lines of the same video signals. Specifically, adjacent scan lines of greatly different lengths bring a large difference of brightness between pixels connected thereto, highlighting a boundary of the brightness difference.

This is to aim at obscuring a boundary of a brightness difference.

SUMMARY OF THE INVENTION

A display device may include a substrate; a plurality of signal lines on the substrate; a plurality of scan lines on the substrate, the scan lines crossing the signal lines; and a plurality of thin film transistors at crossing positions of the scan lines and the signal lines. The scan lines include some first scan lines and some second scan lines. Each of the second scan lines has an end connected to a load element.

Each of the second scan lines is connected to a load element, which may adjust an interconnection load, whereby a brightness difference can be made obscure.

BRIEF DESCRIPTION OF THE DRAWINGS

FIG. 4 is a IV-IV line cross sectional view of the display device in FIG. 1.

DETAILED DESCRIPTION OF THE INVENTION

Figure 1:
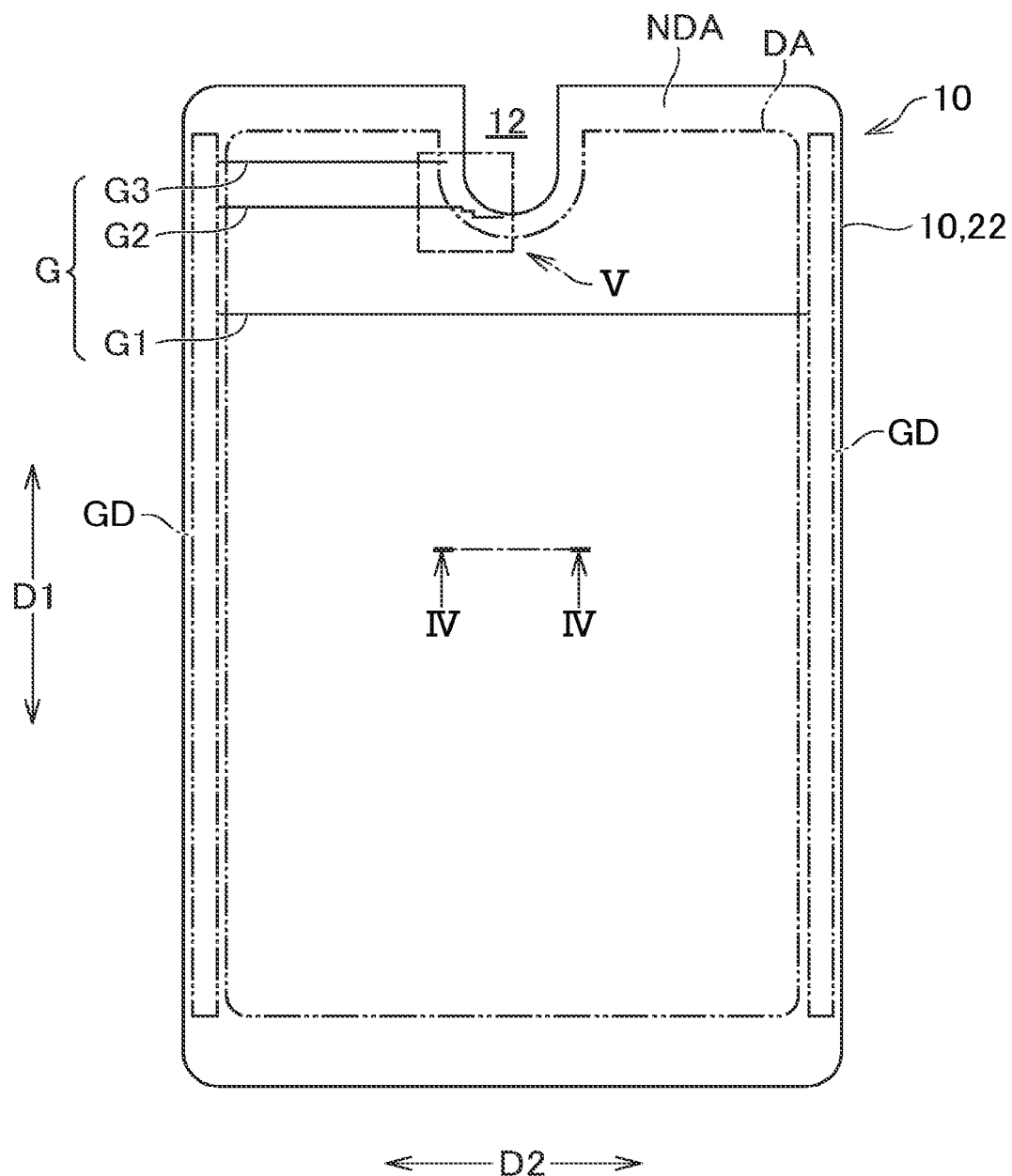
FIG. 1 is a schematic plan view of a display device in accordance with an embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

FIG. 1 is a schematic plan view of a display device in accordance with an embodiment. The display device has a first substrate 10. The first substrate 10 has a display area DA to show images. Outside (around) the display area DA is a non-display area NDA.

The first substrate 10 has a cutout 12. The cutout 12 is formed at one of both ends of the first substrate 10 in a first direction D1 and is also formed at the midpoint of the first substrate 10 in a second direction D2 (orthogonally) crossing the first direction D1. The cutout 12 prevents the display area DA from continuously extending in the second direction D2. The cutout 12 has a U-shape, and correspondingly the first substrate 10 has a curved line in its outer shape. The non-display area NDA includes a region adjacent to the cutout 12.

Figure 2:
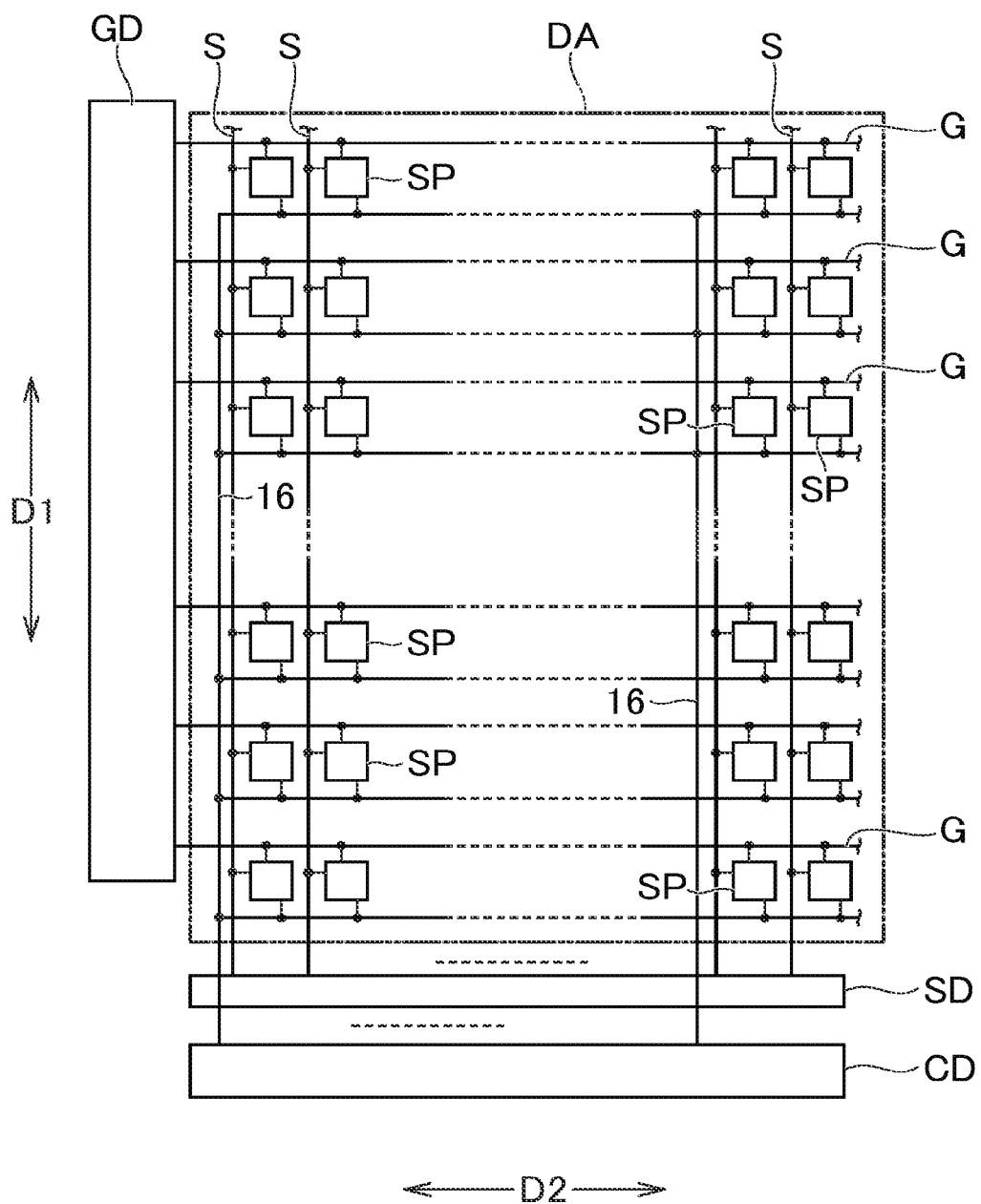
FIG. 2 is a circuit diagram of the display device in FIG. 1.
Figure 3:
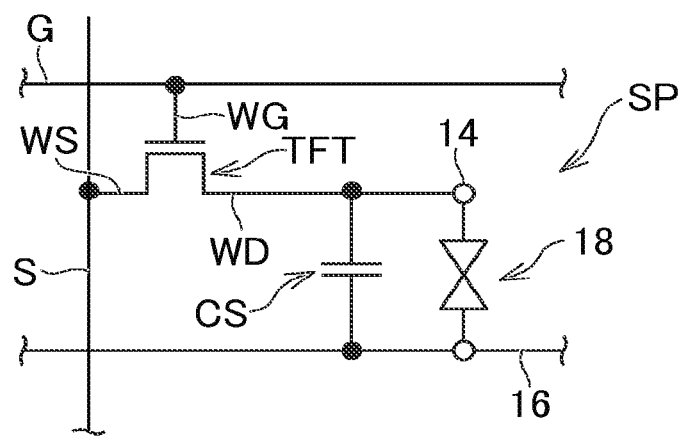
FIG. 3 is a detail view of a part of the circuit in FIG. 2.

FIG. 2 is a circuit diagram of the display device in FIG. 1. FIG. 3 is a detail view of a part of the circuit in FIG. 2.

The first substrate 10 is equipped with a plurality of subpixels SP in the display area DA. The subpixel SP is the minimum unit individually controllable in accordance with the video signal and is provided in a region including a thin film transistor TFT at a position where a scan line G and a signal line S cross each other. The subpixels SP are arranged in a matrix shape in a first direction D1 and a second direction D2. The scan lines G extend in the second direction D2 and arranged in the first direction D1. The signal lines S extend in the first direction D1 and arranged in the second direction D2. The scan line G or the signal line S does not have to be strait and may be partially curved. The scan lines G and the signal lines S extend to the non-display area NDA outside the display area DA. In the non-display area NDA, the scan lines G are connected to a scanning circuit GD and the signal lines S are connected to a signal-line driving circuit SD. As shown in FIG. 1, the scanning circuit GD is provided on each of both sides holding the scan lines G therebetween in the second direction D2.

The first substrate 10 has a plurality of pixel electrodes 14 and common electrodes 16, for changing at least brightness of the subpixels SP to form images. The pixel electrodes 14 are arranged in the first direction D1 and the second direction D2. Each pixel electrode 14 is opposed to the common electrode 16, driving a liquid crystal layer 18 with an electric field generated between the pixel electrode 14 and the common electrode 16. The storage capacitor CS may be formed between the common electrode 16 and the pixel electrode 14. The common electrode 16 spreads over the plurality of subpixels SP. The common electrode 16 extends to the non-display area NDA and is connected to the common-electrode driving circuit CD.

A plurality of thin film transistors TFT are arranged in the display area DA. The thin film transistors TFT are arranged, in the first direction D1 and the second direction D2, for the respective pixel electrodes 14. The subpixel SP is equipped with the thin film transistor TFT. The thin film transistor TFT is electrically connected to the scan line G and the signal line S. Specifically, the thin film transistor TFT is equipped with a gate electrode WG, a source electrode WS, and a drain electrode WD. The gate electrode WG is electrically connected to a scan line G. As illustrated, an electrode electrically connected to the signal line S is referred to as the source electrode WS, and another electrode electrically connected to the pixel electrode 14 is referred to as the drain electrode WD. Each scan line G is connected to some thin film transistors TFT in some subpixels SP arranged in the second direction D2.

Each signal line S is connected to some thin film transistors TFT in some subpixels SP arranged in the first direction D1. Electrical connection between each of the pixel electrodes 14 and a corresponding one of the signal lines S is controlled by a corresponding one of the thin film transistors TFT.

FIG. 4 is a IV-IV line cross sectional view of the display device in FIG. 1. A liquid crystal layer 18 is between the first substrate 10 and a second substrate 22. The pixel electrodes 14 are arranged in the first direction D1 and the second direction D2 crossing each other on the first substrate 10 and on its side of the liquid crystal layer 18. The display device is configured to correspond to a display mode using a lateral electric field substantially parallel to a main surface. Or, the display device may be configured to correspond to a display mode using a longitudinal electric field perpendicular to the substrate main surface, an electric field in an oblique direction to the substrate main surface, or a combination thereof. The display mode using the lateral electric field may require both of the pixel electrodes 14 and the common electrode 16 on one of the first substrate 10 and the second substrate 22, for example. The alternative display mode, using the longitudinal electric field or the oblique electric field, may require one(s) of the pixel electrodes 14 and the common electrode 16 on the first substrate 10 and the other(s) of the pixel electrodes 14 and the common electrode 16 on the second substrate 22, for example.

The first substrate 10 may be equipped with the signal lines S, the common electrode 16, a metal layer M, the pixel electrodes 14, a first insulation film IN1, a second insulation film IN2, a third insulation film IN3, and a first alignment film AL1. The thin film transistor TFT and the scan line G and insulation films interposed therebetween, for example, are not shown in FIG. 4. The first insulation film IN1 is on the first substrate 10. The scan line G and a semiconductor layer (channel layer) of the thin film transistor TFT, which are unillustrated, are between the first substrate 10 and the first insulation film IN1. The signal line S is on the first insulation film IN1. The second insulation film IN2 is on the signal line S and the first insulation film IN1. The common electrode 16 is on the second insulation film IN2. The metal layer M is in contact with the common electrode 16, just above the signal line S. The metal layer M is on the common electrode 16 or can be between the common electrode 16 and the second insulation film IN2. The third insulation film IN3 is on the common electrode 16 and the metal layer M. The pixel electrode 14 is on the third insulation film IN3. The pixel electrodes 14 are opposed to the common electrode 16 with the third insulation film IN3 interposed therebetween. The pixel electrode 14 has a slit SL at a position opposed to the common electrode 16. The first alignment film AL1 covers the pixel electrodes 14 and the third insulation film IN3.

The scan line G, the signal line S, and the metal layer M are made from metal such as molybdenum, tungsten, titanium, and aluminum and may have a single-layer structure or a multi-layer structure. The common electrode 16 and the pixel electrodes 14 are made from transparent conductive material such as indium tin oxide (ITO) or indium zinc oxide (IZO). The first insulation film IN1 and third insulation film IN3 are inorganic insulation films, and the second insulation film IN2 is an organic insulation film.

The second substrate 22 may be equipped with a black matrix layer 24, a color filter layer 26, an overcoat layer OC, and a second alignment film AL2. The black matrix layer 24 and the color filter layer 26 are on the second substrate 22, on its side opposed to the first substrate 10. The black matrix layer 24 partitions the subpixels SP and is just above the signal lines S. The color filter layer 26 is opposed to the pixel electrodes 14, partially overlapping with the black matrix layer 24. The overcoat layer OC covers the color filter layer 26. The second alignment film AL2 covers the overcoat layer OC.

On the second substrate 22 are laminated some touch electrodes 28 for touch sensing. The touch electrodes 28 are on a main surface of the second substrate 22. The touch electrodes 28 may be made from metal or transparent conductive material such as indium tin oxide (ITO) or indium zinc oxide (IZO), may have the transparent conductive material on the metal, or may be made from conductive organic material or dispersed fine conducting materials.

The first optical element OD1 with a first polarizing plate is between the first substrate 10 and a lighting device BL. The second optical element OD2 with a second polarizing plate is on the touch electrodes 28. The first optical element OD1 and the second optical element OD2 may include a retardation plate, if necessary.

Figure 5:
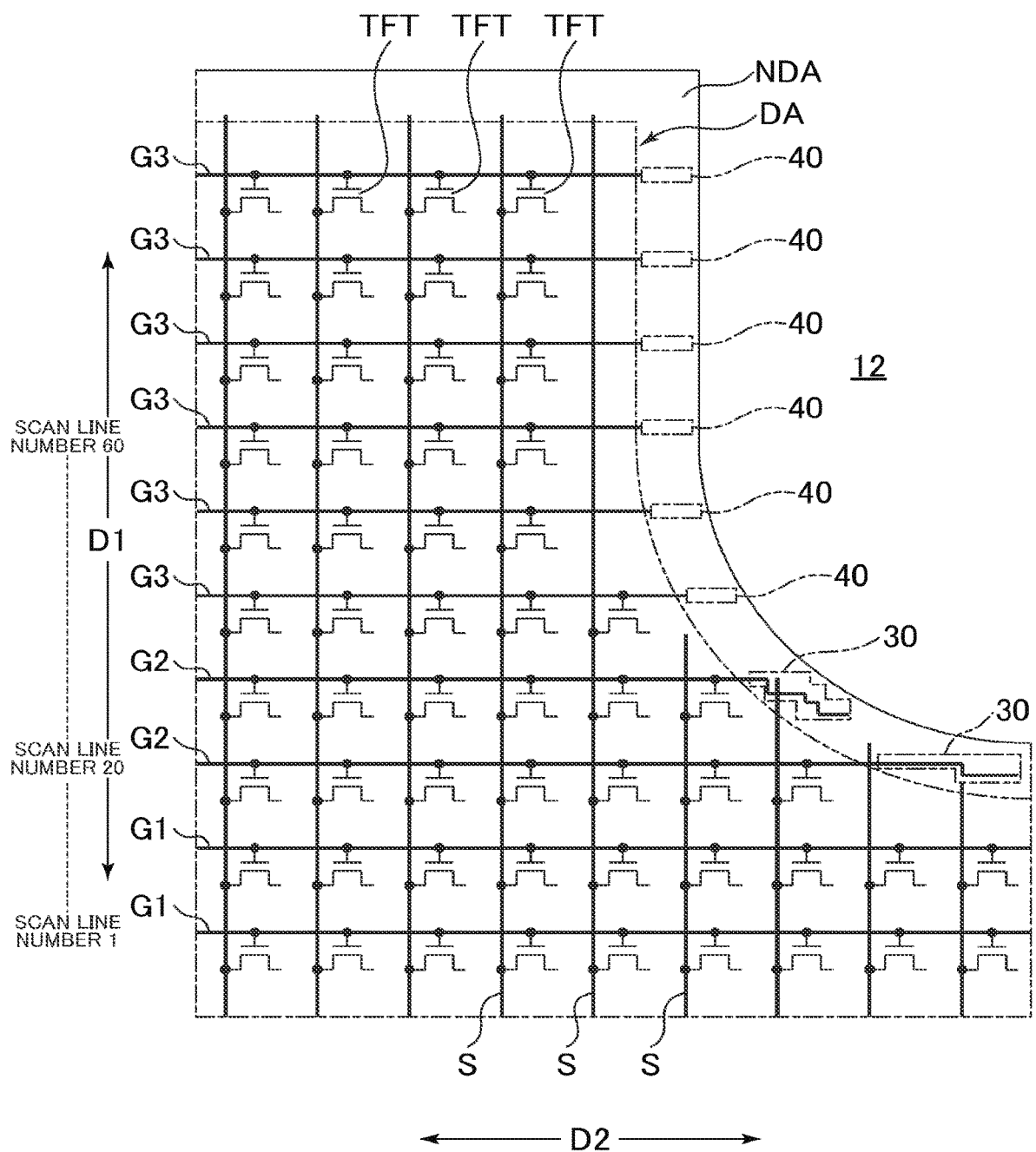
FIG. 5 is a detail view of a structure pertaining to signal lines and scan lines.

FIG. 5 is a detail view of signal lines S and scan lines G in an area V in FIG. 1. The area V includes the cutout 12. As shown in FIG. 5, the scan lines G in the area V have different lengths due to the cutout 12.

The cutout 12 has a round shape at its portion, whereby the scan lines G have lengths to match the round shape. The embodiment includes three groups consisting of a first group G1, a second group G2, and a third group G3.

Among the scan lines G, the first group G1 of scan lines G extends to both ends of the display area DA in the second direction D2 (FIG. 1). Each scan line G in the first group G1, which is a normal scan line, is connected to the scanning circuit GD at each of its both ends.

Among the scan lines G, the second group G2 of scan lines G lies next to the first group G1 in the first direction D1. The second group G2 corresponds to a rounded portion of the cutout 12. The scan lines G in the second group G2 are shorter at least in the display area DA than the scan lines G in the first group G1, because the cutout 12 is formed next to a portion running through the display area DA in the second direction D2, or the non-display area NDA is formed along the cutout 12. In the display area DA, each scan line G in the second group G2 is half or less than half as long as each scan line G in the first group G1. The scan lines G in the second group G2 extend to the non-display area NDA (area between the cutout 12 and the display area DA). The scan lines G in the second group G2 are connected to the scanning circuit GD only on one side.

Among the scan lines G, the third group G3 of scan lines G lies at the outermost end portion in the first direction D1. Similar to the scan lines G in the second group G2, the cutout 12 prevents the scan lines G in the third group G3 from continuing to extend in the second direction D2. Unlike the second group G2, the scan lines G in the third group G3 are substantially equivalent in length, due to a substantially straight edge of the cutout 12, whereas the scan lines G in the second group G2 are different in length. The longest scan line G in the third group G3 is shorter than any one of the scan lines G in the second group G2.

As mentioned above, the scan lines G in the embodiment include several scan lines in different lengths, in addition to the scan lines in the first group G1, which are normal scan lines. As shown in FIG. 5, the thin film transistor TFT for driving the pixel electrode is provided in the region where the scan line G crosses the signal line S. Each scan line G is connected to a different number of thin film transistors TFT in each group. Specifically, the first group G1 that does not overlap with the cutout 12 is greatly different in the length of each scan line, greatly different in the number of the thin film transistors TFT connected to each scan line, and different in the number of gate electrodes from the second and third groups G2, G3 that overlap with the cutout 12. Their loads are greatly different, due to a difference of parasitic capacitance on the respective scan lines. Voltages applied from the same video signals to the respective pixel electrodes are different from pixel to pixel pertaining to the scan lines G in the respective first to third groups, including the first group G1 not overlapping with the cutout 12 and the second and third groups G2, G3 overlapping with the cutout 12, highlighting a brightness difference. For example, while an image of 127/256 gradations is displayed in normal pixels of the first group G1, another image of 180/256 gradations is displayed in pixels of the second and third groups G2, G3, due to a light interconnection load, making the image brighter than that in the pixels of the first group G1. Accordingly, a boundary between the first group and the second group is clearly noticeable.

The embodiment is to add a following structure to the scan lines G of the second and third groups G2, G3 to resolve the above problem.

Each scan line G in the second group G2 at its one end is connected to the scanning circuit GD, for example. Its other end (cutout 12 side) is connected to field-effect elements 30. The field-effect elements 30 are disposed in the non-display area NDA between the cutout 12 and the display area DA. The field-effect elements 30 overlap with the black matrix layer 24 (FIG. 4).

Figure 6:
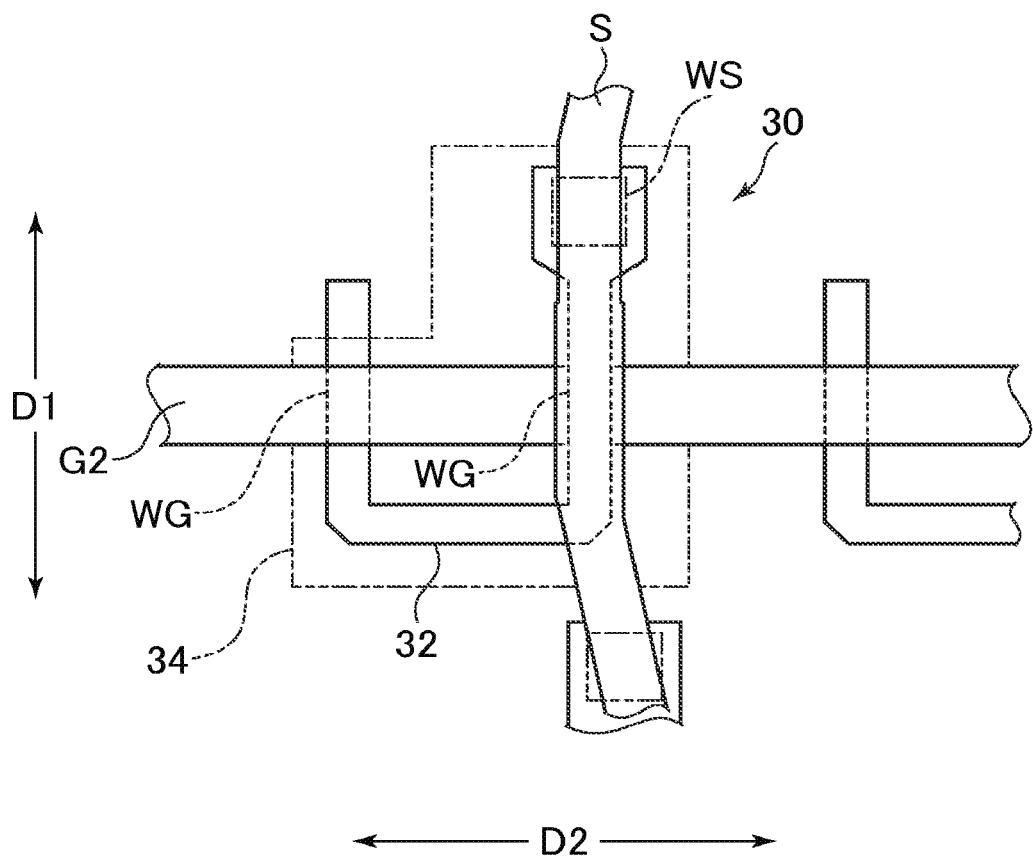
FIG. 6 is a view of a field-effect element.

FIG. 6 is a diagram of the field-effect element 30. The field-effect element 30 includes a partial structure of the thin film transistor TFT (e.g. at least the gate electrode WG and the channel layer 32 and the gate insulation film 34). The gate insulation film 34 is between the channel layer 32 and the gate electrode WG. The channel layer 32 (semiconductor layer) curves in a U-shape, for example, having a bent portion between a pair of portions that overlap with the gate electrode WG.

The field-effect element 30 makes no contribution to display but has a structure substantially similar to the thin film transistor TFT in the display area and may be referred to as a dummy TFT, having one of the source electrode WS and the drain electrode WD (e.g. the source electrode WS) without the other (e.g. the drain electrode WD). The field-effect element 30 has the channel layer 32 connected to the signal line S through the source electrode WS, for example. An unillustrated insulation layer is interposed between the signal line S and the gate electrode WG (scan line G).

The thin film transistor TFT includes a structure of the field-effect element 30 (at least the gate electrode WG and the channel layer 32 and the gate insulation film 34). Similar to the structure in FIG. 6, a part of each scan line G is the gate electrode WG of a corresponding one of the thin film transistors TFT connected to the respective scan lines G in the second group.

As explained, the field-effect element 30 for a dummy thin film transistor is connected to the scan line G, increasing the interconnection load to be closer to the interconnection load of the scan line G in the first group G1.

Figure 7:
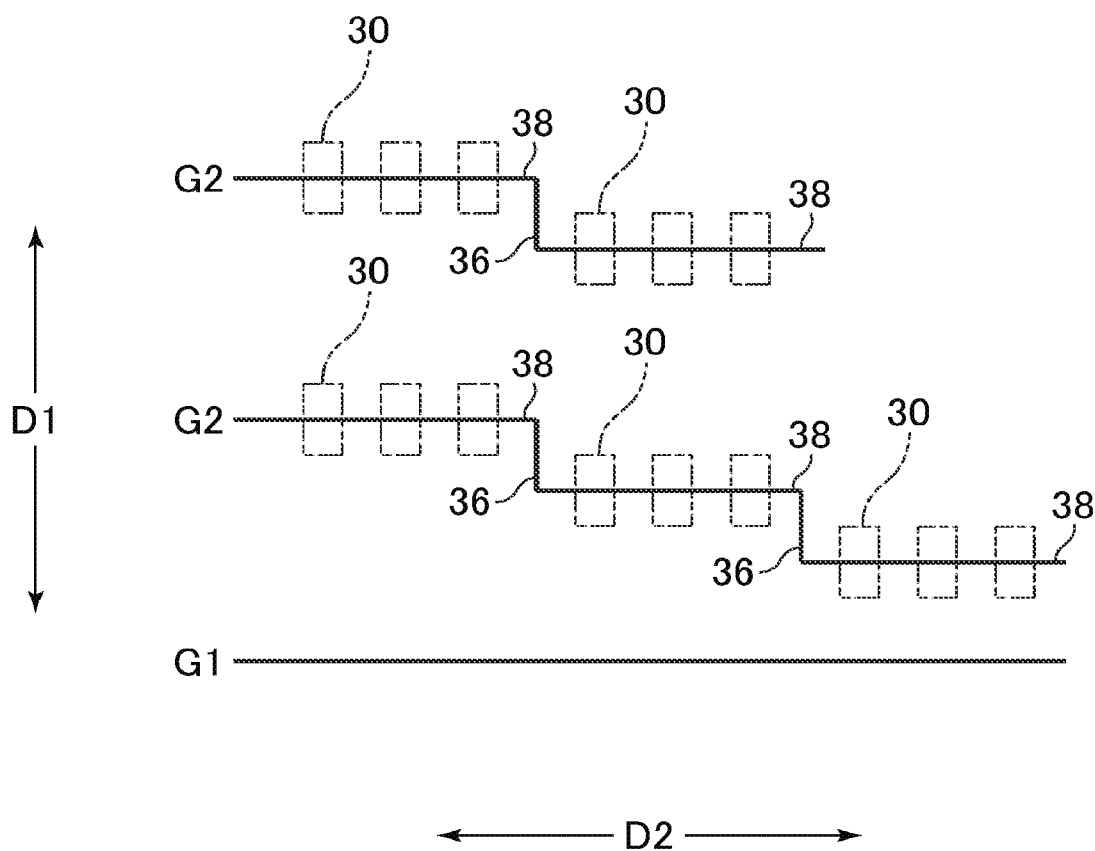
FIG. 7 is a view of arrangement of the field-effect elements.

FIG. 7 is a diagram of arrangement of the field-effect elements 30. The embodiment shows that a closer one of the scan lines G in the second group G2 to the scan lines G in the first group G1 is connected to more field-effect elements 30. The scan lines G in the second group G2 are arranged along a rounded portion of the cutout 12, differentiating lengths of the scan lines G in the second group G2, in the display area DA. In the embodiment, the scan lines G in the second group G2 have respective interconnection loads, differently increased depending on how many field-effect elements 30 are connected to the scan lines G. FIG. 7 shows that a closer one of the scan lines G in the second group G2 to the scan lines G in the first group G1 has a higher interconnection load, due to more field-effect elements 30 connected thereto.

As described above, the voltage applied to each pixel electrode is proportional to its interconnection load. With the structure in FIG. 7, the brightness difference in the second group G2 from the first group G1 varies gradually, whereby the boundary between the first group G1 and the second group G2 can be made obscure.

The non-display area NDA, where the field-effect elements 30 are arranged to be connected to the scan lines G in the second group G2, is a largely curved portion. Each scan line G in the second group G2, in the non-display area NDA, has a first portion 36 extending in a direction (e.g. first direction D1) perpendicular to the second direction D2. Each scan line G in the second group G2, in the non-display area NDA, has some second portions 38 extending in the second direction D2 and shifted from each other in the first direction D1. The second portions 38 are connected to the respective field-effect elements 30.

Such a shape of the scan line G makes the field-effect elements 30 arranged efficiently in the non-display area NDA along its curve.

Next, the scan lines G in the third group G3 are explained. Each scan line G in the third group G3 is connected at its one end to the scanning circuit GD in FIG. 1 and is connected at its other end (cutout 12 side) to the load element 40 in FIG. 5. The load elements 40 are arranged in the non-display area NDA between the cutout 12 and the display area DA in the second direction D2. The load element 40 adds an interconnection load to each scan line G in the third group G3. The load added by the load element 40 is equal to or less than the load added by the field-effect element 30. The load of the load element 40 is not higher than the load of the scan line G in the second group G2 connected the most numerous field-effect elements 30.

Figure 8:
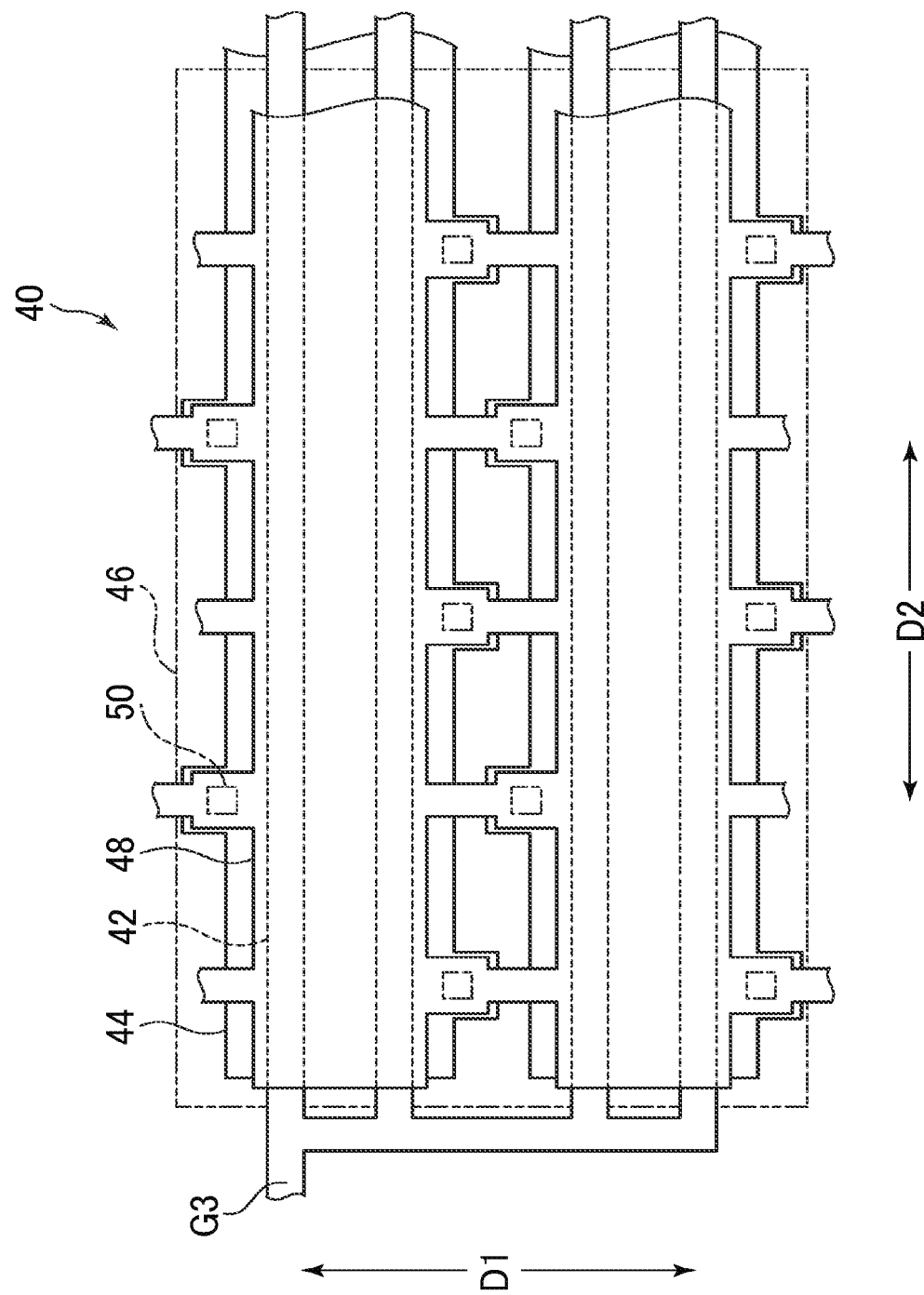
FIG. 8 is a view of a load element.

FIG. 8 is a diagram of the load element 40. The scan line G branches into some portions for first electrodes 42 in the load element 40. The load element 40 has a second electrode 44 under the first electrode 42. The second electrode 44 is a layer (e.g. semiconductor layer in the same layer) continuously integrated with the channel layer 32 of the field-effect element 30. The first electrode 42 and the second electrode 44 are opposed to each other with an insulation film 46 interposed therebetween. The insulation film 46 is a film continuously integrated with the gate insulation film 34 of the field-effect element 30. The load element 40 has a third electrode 48 above the first electrode 42. The third electrode 48 is in the same layer as the signal line S but is separated from the signal line S and is connected to other potential. The first electrode 42 and the third electrode 48 are opposed to each other with an unillustrated insulation layer interposed therebetween. The second electrode 44 and the third electrode 48 are connected to each other through a contact 50. The first electrode 42 serves as one electrode and each of the second electrode 44 and third electrode 48 serves as another electrode, forming a capacitance.

The third group G3 includes scan lines next to an almost straight section of the cutout 12. The non-display area NDA, where the load elements 40 are arranged, has an almost straight shape. The load elements 40 connected to the respective scan lines G in the third group G3 have the same shape.

Figure 9:
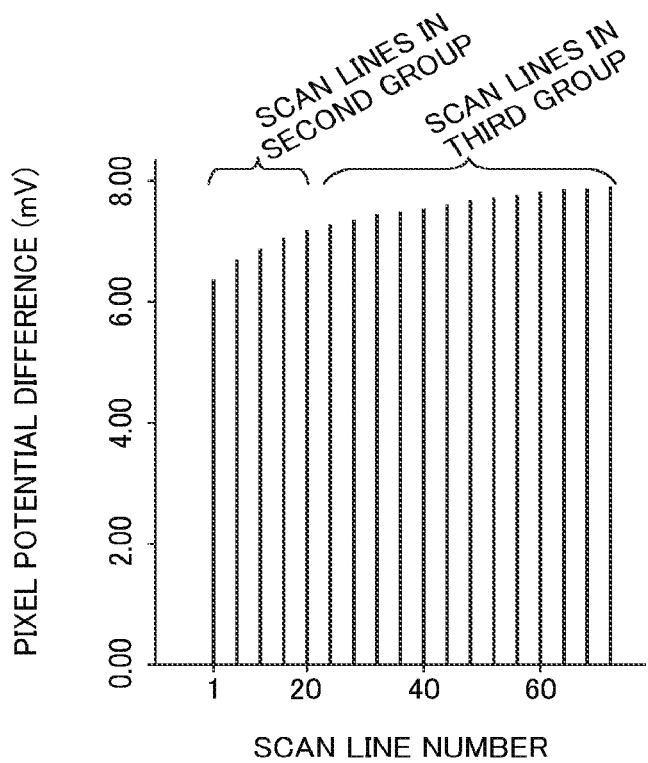
FIG. 9 is a view of an experimental result in a comparative example.
Figure 10:
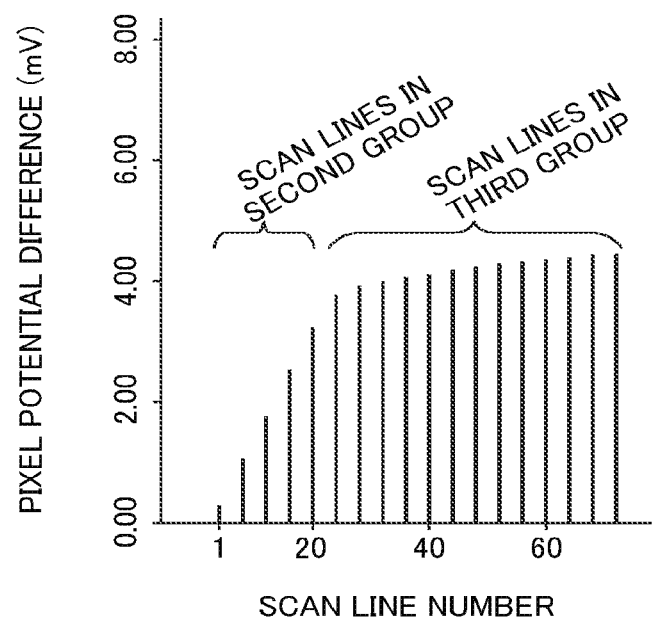
FIG. 10 is a view of an experimental result in the embodiment.

FIG. 9 is a diagram to show experimental results of a comparative example. FIG. 10 is a diagram to show experimental results of the embodiment.

In the experiments, a potential difference is measured between the scan line G in the first group G1 and each pixel electrode 14 connected to a corresponding one of the scan lines G in the second and third groups G3, G2, where the same voltage signal is input to the signal line S. In the graph of the experimental results, the lateral axis shows the scan line number in ascending order in a direction away from the scan lines G in the first group G1, the scan line number being common in FIG. 5. The longitudinal axis shows the potential difference from the potential of the pixel electrodes 14 connected to the scan lines G in the first group G1 in the normal display section.

The experiment of the comparative example (FIG. 9) uses a display device without the above-mentioned field-effect element 30 and the load element 40. The scan line G of the scan line number 1 is a scan line next to the first group G1, where normal scan lines G are arranged without overlapping with the cutout 12, making a potential difference of about 6.2 mV from the scan line G in the first group G1. The scan lines G in the second group G2 make potential differences of about 6.2 mV to 7.2 mV, leaving a gap of about 1 mV in the scan lines G in the second group G2.

The scan lines G in the third group G3 make potential differences of about 7.2 mV to 8.0 mV, leaving a gap of about 0.8 mV in the scan lines G in the third group G3.

The scan lines G in the second and third groups G2, G3 wholly make potential differences of about 1.6 mV at most.

The result shows that the pixel potential difference between the first group G1 and the second group G2 is several times larger than the pixel potential difference between the second group G2 and the third group G3. As a result, in a case where the same video signals are input to all the pixels in the display area DA, due to the large pixel potential difference between the first group G1 and the second group G2, a viewer may notice a brightness difference among the pixels in the first, second, and third groups 1G, G2, and G3.

The experiment in the embodiment (FIG. 10) uses a display device equipped with the field-effect elements 30 and load elements 40. FIG. 10 shows that the scan line number 1 makes a potential difference, as very low as about 0.2 mV, from the scan lines in the first group G1. Each scan line G in the second group G2 is equipped with the field-effect element 30, and a scan line G closer to the first group G1 has more field-effect elements 30. Consequently, the scan lines G in the second group G2 have respective potential differences from the first group G1 gradually increased, one by one among the scan line numbers 1-20, up to the potential in the third group G3.

Additionally, each scan line G in the third group G3 is connected to a load element 40, whereby the pixel electrode 14 has the potential difference from the first group G1 lowered to about 4 mV.

In the embodiment, the pixel electrodes in the third group G3 have a smaller potential difference from the first group G1, and a closer one of the scan lines in the second group G2, to the scan lines G in the first group G1, has a higher load. Consequently, as shown in FIG. 10, the pixels connected to the scan lines G in the second and third groups G2, G3 with the cutout 12 overlapping with them have smaller brightness differences from the pixels connected to the scan lines G1 in the first group G1 with the cutout 12 not overlapping with it. The interconnection loads are adjusted for graduation in a brightness difference in the second group G2 next to the first group G1.

The embodiment is successful in positively forming a gradation in brightness from the scan lines in the first group G1 to the scan lines in the third group G3. In contrast to the comparative example in FIG. 9, a boundary due to a brightness difference is made obscure between the first group G1 and the second group G2.

The invention is not limited to the above embodiment and various modifications may be made thereto. For example, instead of the load elements 40, the third group G3 may be connected to the field-effect elements 30 for the second group G2.

Alternatively, instead of breaking the scan lines overlapping with the cutout 12 into two consisting of the second group G2 and the third group G3, the load elements connected to either the second group G2 or the third group G3 can be used, in a case where the cutout 12 has no rounded shape and the scan lines overlapping with the cutout 12 are equivalent in lengths.

The embodiment is explained using a liquid crystal display device, which can be replaced with an organic EL display device with the same structure.

The structures explained in the embodiment may be replaced with substantially the same structures and other structures that can achieve the same effect or the same objective.

What is claimed:

1. A display device comprising:
   a substrate having a display area and a non-display area;
   a plurality of signal lines extending in a first direction within the display area;

a plurality of scan lines extending in a second direction crossing the signal lines within the display area;

a plurality of thin film transistors disposed in the display area; and a scanning circuit disposed along an edge of the substrate, wherein the scan lines include a first scan line, a second scan line and a third scan line, a first end of the first scan line, a second end of the second scan line and a third end of the third scan line are connected to the scanning circuit, a first number of the thin film transistors is connected to the first scan line, a second number of the thin film transistors is connected to the second scan line, a third number of the thin film transistors is connected to the third scan line within the display area, the second number is smaller than the first number, and the third number is smaller than the second number, the first scan line includes a fourth end, the second scan line includes a fifth end, and the third scan line includes a sixth end;

a first load element is connected to the fifth end of the second scan line within the non-display area, a second load element is connected to the sixth end of the third scan line within the non-display area, and the first load element is not connected to the first scan line.

2. The display device according to claim 1, wherein each of the first load element and the second load element is a field-effect element.

3. The display device according to claim 1, wherein a length of the second scan line is shorter than a length of the first scan line, and a length of the third scan line is shorter than a length of the second scan line.

4. The display device according to claim 3, wherein a fourth number of the field-effect elements is connected to the second scan line, a fifth number of the field-effect elements is connected to the third scan line, the fourth number is smaller than the fifth number.

* * * * *